(12) United States Patent
Asghari et al.

(10) Patent No.: US 9,025,241 B2
(45) Date of Patent: May 5, 2015

(54) GAIN MEDIUM PROVIDING LASER AND AMPLIFIER FUNCTIONALITY TO OPTICAL DEVICE

(75) Inventors: Mehdi Asghari, Pasadena, CA (US); Dazeng Feng, El Monte, CA (US)

(73) Assignee: Kotura, Inc., Monterey Park, CA (US)

( * ) Notice: Subject to any disclaimer, the term of this patent is extended or adjusted under 35 U.S.C. 154(b) by 402 days.

(21) Appl. No.: 13/317,340

(22) Filed: Oct. 14, 2011

(65) Prior Publication Data

US 2013/0094074 A1    Apr. 18, 2013

(51) Int. Cl.
*H01S 5/40* (2006.01)
*H01S 5/022* (2006.01)
*H01S 5/026* (2006.01)
*H01S 5/10* (2006.01)
*H01S 5/50* (2006.01)

(52) U.S. Cl.
CPC .......... *H01S 5/02252* (2013.01); *H01S 5/0262* (2013.01); *H01S 5/0265* (2013.01); *H01S 5/1032* (2013.01); *H01S 5/4012* (2013.01); *H01S 5/4062* (2013.01); *H01S 5/50* (2013.01)

(58) Field of Classification Search
CPC .................................................. H01S 5/4012
USPC ........................................... 359/344; 385/14
See application file for complete search history.

(56) References Cited

U.S. PATENT DOCUMENTS

| | | | |
|---|---|---|---|
| 5,394,261 A * | 2/1995 | Nakamura .................... 398/182 |
| 5,394,489 A * | 2/1995 | Koch .............................. 385/14 |
| 5,745,613 A * | 4/1998 | Fukuchi et al. ................. 385/24 |
| 5,870,512 A * | 2/1999 | Koch et al. ...................... 385/14 |
| 5,926,297 A * | 7/1999 | Ishikawa et al. ................ 398/43 |
| 6,061,369 A * | 5/2000 | Conradi ............................ 372/6 |
| 6,275,317 B1 * | 8/2001 | Doerr et al. .................... 398/201 |
| 6,392,751 B1 * | 5/2002 | Koch et al. .................... 356/478 |
| 6,411,418 B1 * | 6/2002 | Deri et al. ...................... 398/182 |
| 6,490,044 B1 * | 12/2002 | Koch et al. .................... 356/478 |
| 6,803,604 B2 * | 10/2004 | Takahashi et al. .............. 257/80 |
| 6,924,926 B2 * | 8/2005 | Islam et al. .................... 359/334 |
| 6,977,769 B2 * | 12/2005 | Matsushita et al. ........... 359/334 |
| 7,062,114 B2 * | 6/2006 | Webjorn et al. ................. 385/14 |
| 7,079,310 B2 * | 7/2006 | Chen ............................. 359/337 |
| 7,079,715 B2 * | 7/2006 | Kish et al. ....................... 385/14 |
| 7,079,718 B2 * | 7/2006 | Welch et al. .................... 385/14 |
| 7,099,530 B2 * | 8/2006 | Shin et al. ....................... 385/27 |
| 7,103,239 B2 * | 9/2006 | Kish et al. ....................... 385/14 |
| 7,110,168 B2 * | 9/2006 | Lee et al. .................. 359/341.32 |
| 7,129,100 B2 * | 10/2006 | Joyner et al. .................... 438/14 |
| 7,130,499 B2 * | 10/2006 | Grubb et al. .................... 385/14 |
| 7,167,301 B2 * | 1/2007 | Akiyama ...................... 359/344 |
| 7,218,441 B2 * | 5/2007 | Tokura et al. ................. 359/334 |
| 7,224,519 B2 * | 5/2007 | Shin et al. .................... 359/344 |
| 7,277,462 B2 * | 10/2007 | Paoletti et al. ........... 372/50.121 |
| 7,283,694 B2 * | 10/2007 | Welch et al. .................... 385/14 |
| 7,375,878 B2 * | 5/2008 | Akiyama ...................... 359/344 |
| 7,424,041 B2 * | 9/2008 | Meliga et al. ................... 372/20 |
| 7,477,807 B2 * | 1/2009 | Welch et al. .................... 385/14 |

(Continued)

*Primary Examiner* — Ari M Diacou
(74) *Attorney, Agent, or Firm* — Gavrilovich, Dodd & Lindsey, LLP

(57) ABSTRACT

An optical device includes a gain medium on a substrate. The device also includes one or more laser cavities and an amplifier on the substrate. The one or more laser cavities each guides a light signal through a different region of the gain medium such that each of the light signals is amplified within the gain medium. The amplifier guides an amplified light signal through the gain medium such that the amplified light signal is amplified in the gain medium.

16 Claims, 10 Drawing Sheets

(56) References Cited

U.S. PATENT DOCUMENTS

| | | | | |
|---|---|---|---|---|
| 7,512,295 | B2* | 3/2009 | Welch et al. | 385/14 |
| 7,643,207 | B2* | 1/2010 | Dagens et al. | 359/344 |
| 7,734,189 | B2* | 6/2010 | Ranganath | 398/182 |
| 7,817,688 | B2* | 10/2010 | Uberna et al. | 372/27 |
| 7,873,082 | B2* | 1/2011 | Takabayashi | 372/20 |
| 7,945,131 | B1 | 5/2011 | Asghari | |
| 8,149,503 | B2* | 4/2012 | Kim et al. | 359/344 |
| 8,384,993 | B2* | 2/2013 | Landais et al. | 359/344 |
| 8,463,088 | B1* | 6/2013 | Asghari et al. | 385/14 |
| 8,488,637 | B2* | 7/2013 | Fukuda | 372/20 |
| 8,503,073 | B2* | 8/2013 | Ramuz et al. | 359/344 |
| 8,531,761 | B2* | 9/2013 | Chann et al. | 359/333 |
| 2002/0064333 | A1* | 5/2002 | Shigeta et al. | 385/14 |
| 2002/0154372 | A1* | 10/2002 | Chung et al. | 359/182 |
| 2002/0179929 | A1* | 12/2002 | Takahashi et al. | 257/184 |
| 2003/0035202 | A1* | 2/2003 | Islam et al. | 359/334 |
| 2003/0067675 | A1 | 4/2003 | Wang et al. | |
| 2003/0067677 | A1* | 4/2003 | Islam et al. | 359/344 |
| 2003/0081878 | A1* | 5/2003 | Joyner et al. | 385/14 |
| 2003/0099425 | A1* | 5/2003 | Grubb et al. | 385/14 |
| 2004/0067006 | A1* | 4/2004 | Welch et al. | 385/14 |
| 2004/0125846 | A1* | 7/2004 | Zediker et al. | 372/50 |
| 2004/0247233 | A1* | 12/2004 | Grubb et al. | 385/14 |
| 2004/0258422 | A1* | 12/2004 | Grubb et al. | 398/183 |
| 2005/0063704 | A1* | 3/2005 | Lee et al. | 398/66 |
| 2005/0201675 | A1* | 9/2005 | Knopp et al. | 385/27 |
| 2005/0243874 | A1* | 11/2005 | Paoletti et al. | 372/20 |
| 2005/0244994 | A1* | 11/2005 | Meliga et al. | 438/22 |
| 2006/0024066 | A1* | 2/2006 | Fujiwara et al. | 398/183 |
| 2008/0019638 | A1* | 1/2008 | Kwon et al. | 385/29 |
| 2008/0219304 | A1* | 9/2008 | Kupershmidt et al. | 372/29.02 |
| 2010/0246629 | A1* | 9/2010 | Fujii et al. | 372/50.121 |
| 2012/0163821 | A1 | 6/2012 | Kwon et al. | |

* cited by examiner

GAIN MEDIUM PROVIDING LASER AND AMPLIFIER FUNCTIONALITY TO OPTICAL DEVICE

FIELD

The present invention relates to optical devices and more particularly to an optical chip for generating a laser.

BACKGROUND

Optical communication systems often employ lasers as the source of the light signals that are processed by the system. These lasers are generally solid state lasers where the gain medium is defined by one or more solid layers of a chip. Increasing the intensity of the output from these lasers can improve the performance of these systems. As a result, there is a need to increase the intensity of the output from solid state lasers devices.

SUMMARY

An optical device includes a gain medium on a substrate. The device also includes one or more laser cavities and an amplifier on the substrate. The one or more laser cavities each guides a light signal through the gain medium such that each of the light signals is amplified within the gain medium. The amplifier guides an amplified light signal through the gain medium such that the amplified light signal is amplified in the gain medium.

BRIEF DESCRIPTION OF THE FIGURES

FIG. 7A is a topview of the optical device and FIG. 7B is a perspective view of the device.

FIG. 8A is a bottom view of the laser bar.

FIG. 8B is a cross-section of the laser bar shown in FIG. 8A taken along the line labeled B in FIG. 8A.

FIG. 8C is a cross-section of the laser bar shown in FIG. 8A taken along the line labeled C in FIG. 8A.

FIG. 8D is a topview of the laser bar shown in FIG. 8A.

DESCRIPTION

An optical device includes a gain medium on a substrate. The device also includes one or more laser cavities and an amplifier on the substrate. The one or more laser cavities each guides a light signal through the gain medium such that each of the light signals is amplified within the gain medium. The amplifier guides an amplified light signal through the gain medium such that the amplified light signal is amplified in the gain medium. As a result, the same gain medium is used in both the laser cavities and also in one or more amplifiers.

In some instances, the device includes other components such as modulators and light signal modulators. These components can receive and process the laser light signals produced by the laser cavities. After processing by these components, the light signals are then received and amplified by the amplifier before being received by secondary components such as an optical fiber. The amplification can compensate for optical loss resulting from the processing by the components and/or can reduce the power requirements of the laser cavities. Further, since the gain medium is already present on the device for use in the laser cavities, the use of this same gain medium in the amplifier does not substantially increase the cost and/or manufacturing complexity of the device. Further, the additional amplification need not be associated with substantial increases in the size of the device.

Figure 1A:
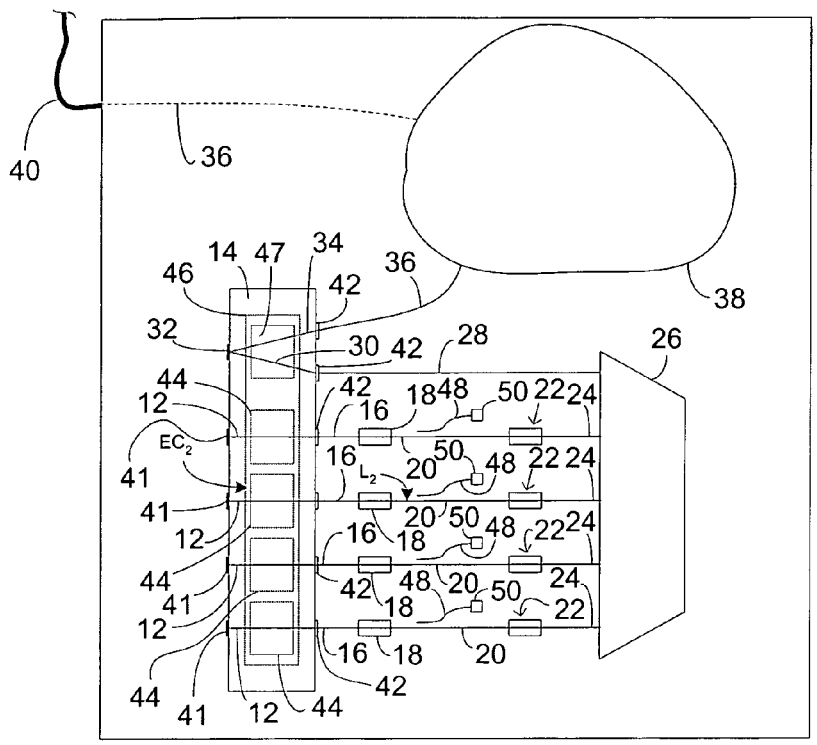
FIG. 1A is a schematic of an optical device that includes a gain medium that provides both laser and amplifier functionality to the optical device.

FIG. 1A is a schematic of an optical device that includes a gain medium 14 that provides both laser and amplifier functionality to the optical device. The device includes gain waveguides 12 defined in a gain medium 14. Cavity waveguides 16 each provides an optical pathway from the gain waveguides 12 to a partial return device 18. Laser waveguides 20 each provides an optical pathway from one of the partial return devices 18 to a modulator 22. Modulated waveguides 24 each provides an optical pathway from one of the modulators 22 to a combiner 26. A common waveguide 28 provides an optical pathway from the combiner 26 back to the gain medium 14.

A first amplifier waveguide 30 provides an optical pathway from the common waveguide 28, through the gain medium 14, to an amplifier reflector 32. A second amplifier waveguide 34 provides an optical pathway from the amplifier reflector 32 through the gain medium 14. An output waveguide 36 provides an optical pathway from the second amplifier waveguide 34 to components 38 included on the device. Examples of suitable optical components include, but are not limited to, demultiplexers, multiplexers, filters, switches, amplifiers, star couplers, optical fibers, circulators, optical attenuators, etc.

The components are optional. In some instances, the output waveguide 36 does not provide an optical pathway to optical components but instead terminates at a facet. For instance, the output waveguide 36 shown in FIG. 1A can continue to the dashed line shown in FIG. 1A. The output waveguide 36 can then end in a facet located at or near an edge of the device. The device can then be connected to an optical fiber 40 such that the optical fiber 40 receives light guided by the output waveguide 36.

During operation of the device, the cavity waveguides 16 each guides a light signal from the gain medium 14 to the partial return device 18. Each partial return device 18 returns a first portion of the received light signal along its original path and permits a second portion of the light signal to enter the laser waveguide 20. As a result, the second portion of each light signal serves as a laser signal output by a laser cavity.

The cavity waveguides 16 each carries the first portion of the light signal back to one of the gain waveguides 12. The gain waveguides 12 each guides the received first portion of the light signal through the gain medium 14 to a reflector 41. Each reflector 41 reflects the received light signal portion such that the first light signal portion returns to the gain waveguide 12 from which it came. As a result, the reflected light signal portions each eventually return to the partial return device 18 from which it originated. Accordingly, the first light signal portions each travels through a gain waveguide 12 twice before returning to the partial return device 18. Since the partial return device once again returns another portion of the returned first light signal portion, the first portion of the light signal passes through the gain medium 14 multiple times when traveling back and forth between one of the reflectors 41 and the associated partial return device 18. As a result, each reflector 41 and the associated partial return device 18 define one of the laser cavities on the device.

While the first portion of the light signal is making multiple passes through the gain medium 14, energy is applied to the gain medium 14 so as to provide the optical gain needed to cause lasing within the gain medium. In some instance, the energy is electrical energy provided by the electronics but other forms of energy can be used. The reflectors 41 can each be highly reflective so substantially all of the first light signal portions are returned to one of the gain waveguides 12.

The partial return devices 18 can be wavelength dependent in that the partial return devices 18 each returns to the gain medium 14 only particular wavelengths of light while transmitting all other wavelengths. Only the wavelengths returned to the gain medium 14 lase. Accordingly, the selection of wavelengths in each laser signal (the second portion of the light signal that passes the partial return device 18) are in the range of wavelengths returned by the partial return device 18 from which the laser signal exits. Additionally, each of the partial return devices 18 can be configured to return a different range of wavelengths. As a result, each of the different laser signals can include a different range of wavelengths. When the range of wavelengths returned by each of the partial return devices 18 is narrow, each of the different laser signals can be at a different wavelength or can include a different channel. An example of partial return devices 18 that can each return light in a range of wavelengths while transmitting light of other wavelengths are reflective optical gratings such as Bragg gratings.

The laser waveguides 20 each guide one of the laser signals to a modulator 22. Electronics can operate the modulator 22 so as to modulate the laser signals. The modulated waveguides 24 each carries one of the modulated light signals to the combiner 26. The combiner 26 combines the received light signals into an output signal received by the common waveguide 28.

The common waveguide 28 guides the output signal to the first amplifier waveguide 30. The first amplifier waveguide 30 guides the output signal through the gain medium 14 to the amplifier reflector 32. When the output light signal is being guided through the gain medium 14, energy can be applied to the gain medium 14 to amplify the output signal. In some instance, the energy is electrical energy applied to the gain medium 14 by electronics but other forms of energy can be used. The amplifier reflector 32 can be highly reflective so substantially all of the amplified light signal is reflected. As a result, the amplified light signal is received in the second amplifier waveguide 34 which guides the amplified light signal through the gain medium 14 a second time. The application of energy to the gain medium 14 causes the amplified light signal to be further amplified during the second pass through the gain medium 14.

The amplifier is distinguishable from the laser cavities because the laser cavities rely on multiple passes of photons through the laser cavity. In contrast, the amplifier operates on a single pass of a photon through the amplifier. As discussed above, the multiple photon passes in the laser cavities are the result of the partial return devices 18 and the reflectors 41 being positioned so photons return along their original pathways. This contrasts with the path of a photon through the amplifier. The amplifier waveguides and the amplifier reflector 32 are positioned so the photons travel through the amplifier a single time.

The functionality of the amplifier and laser cavities can optionally be enhanced by the placement of anti-reflective coatings 42 on the gain medium 14. The anti-reflective coatings 42 can be positioned on surfaces through which light is to be transmitted without reflection or with minimal reflection.

The output waveguide 36 receives the amplified light signal from the second amplifier waveguide 34. When the device includes optical components, the output waveguide 36 guides the amplified light signal to the components. When the output waveguide 36 terminates at a facet, the output waveguide 36 guides the amplified light signal to the facet. Accordingly, when an optical fiber 40 is aligned with the facet, the optical fiber 40 receives the amplified light signal from the output waveguide 36.

FIG. 1A includes dashed lines showing the location of multiple first electrical conductors 44 and a common electrical contact 46. The first electrical conductors 44 and the common electrical contacts 46 are each in electrical communication with the gain medium 14 and can each be in direct physical contact with the gain medium 14. Additionally, the gain medium 14 can be between first electrical conductors 44 and the common electrical contact 46. Electronics (not shown) can be in electrical communication with the first electrical conductors 44 and the common electrical contact 46 and can be configured to use these electrical contacts to apply electrical energy to the gain medium 14.

Four lasers are shown in FIG. 1A although the device can include more or less than four lasers. As is evident from FIG. 1A, each of the first electrical conductors 44 is associated with one of the lasers. As a result, the electronics can apply electrical energy to the gain medium 14 associated with a particular one of the lasers and accordingly increase or decrease the intensity of the laser signal produced by that laser. For instance, the electronics can increase the electrical energy applied between the common electrical contact 46 and the first electrical conductor 44 labeled $EC_2$ in FIG. 1A in order to increase the intensity of the laser signal labeled $L_2$ in FIG. 1A.

FIG. 1A includes dashed lines showing the location of an amplifier electrical contact 47. The amplifier electrical contact 47 can be in electrical communication with the gain medium 14 and in direct physical contact with the gain medium 14. Additionally, the gain medium 14 can be between amplifier electrical contact 47 and the common electrical contact 46. Electronics (not shown) in electrical communication with the amplifier electrical contacts 47 and the common electrical contact 46 can be configured to use these electrical contacts to apply electrical energy to the gain medium 14. The electronics can be configured to apply the electrical energy to the gain medium 14 such that the output light signal is amplified upon traveling through the first amplifier waveguide 30 and the second amplifier waveguide 34. Accordingly, the electronics can adjust the level of amplification of the amplified light signal by increasing or decreasing the intensity of electrical energy applied through the amplifier electrical contact 47.

In some instances, the device includes one or more coupled waveguides 48 that are each optically coupled with the laser waveguide 20 such that a portion of the laser signal guided by the optically coupled laser waveguide 20 is coupled into the coupled waveguide 48. The coupled waveguide 48 guides the tapped portion of the laser signal to a light sensor 50. Each of the light sensors 50 is configured to convert the received light signal to an electrical signal. The electronics can be in electrical communication with the light sensor 50 and can receive the electrical signal from the light sensor 50.

During operation of a device that includes coupled waveguides 48, the electronics receive the electrical signal from the light sensor 50. The electronics can also adjust the level of electrical energy applied to each of the lasers in response to the electrical signal received from the light sensor 50 associated with that laser in a feedback loop. For instance, in the event that the electrical signal from one of the light sensors 50 indicates that the intensity of the laser signal being received by the light sensor 50 is above a threshold, the electronics can reduce the electrical energy applied to the gain medium 14 associated with the laser that produced the laser signal in order to reduce the intensity of the laser signal received by that light sensor 50.

Figure 1B:
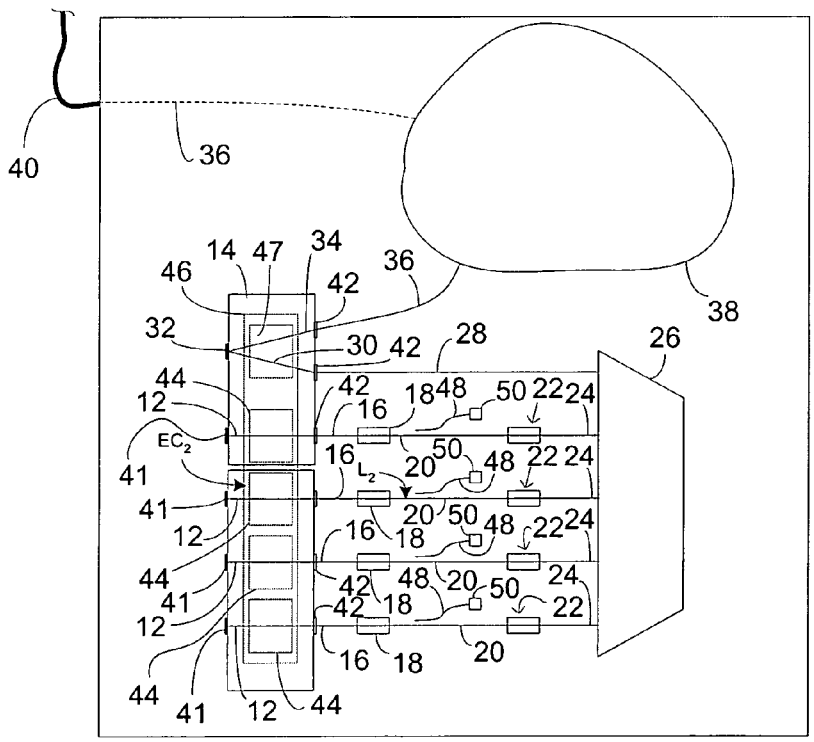
FIG. 1B is a topview of another embodiment of the device shown in FIG. 1A.

Although FIG. 1A shows each of the lasers using the same gain medium 14, different lasers can employ different gain media. For instance, FIG. 1B shows that device of FIG. 1A but one of the laser cavities uses a different gain medium 14 than the other laser cavities. Such an arrangement may be suitable for instances where it is desirable to create laser signals of different wavelengths with different gain media. One of the gain media is shared by one of the laser cavities and also by the amplifier.

Figure 2:
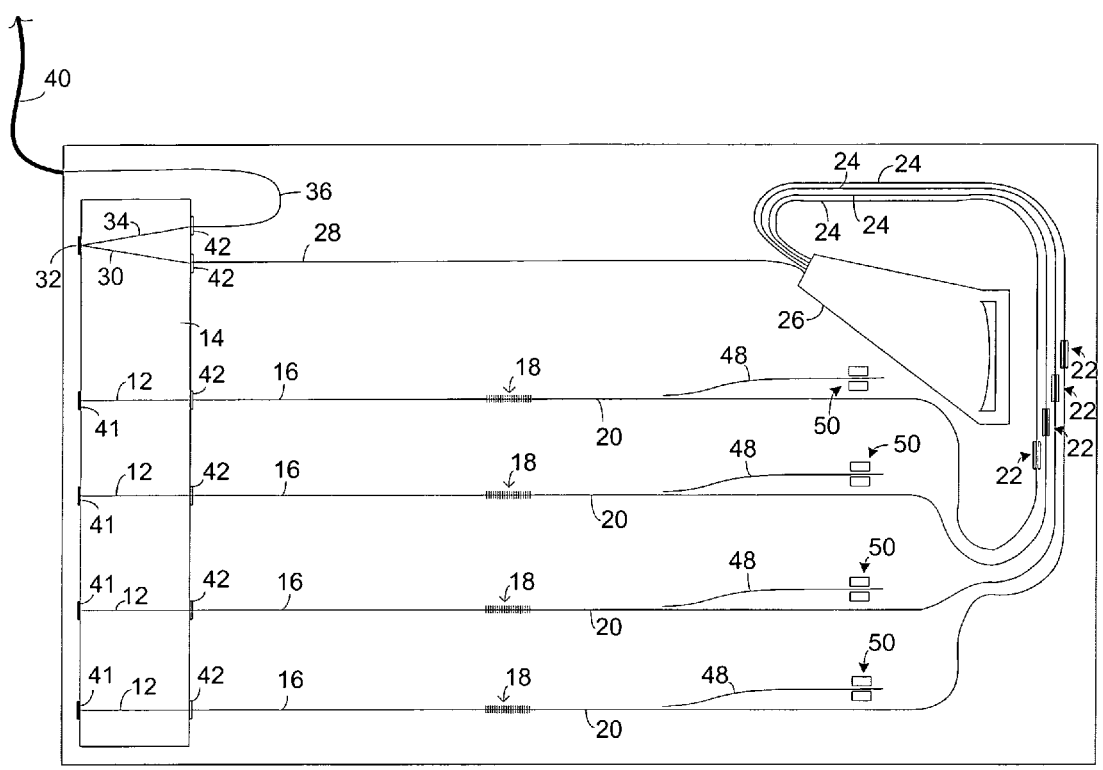
FIG. 2 is a topview of a device constructed according to FIG. 1A.

FIG. 2 is a topview of a device constructed according to FIG. 1A. The device is laid out on a silicon-on-insulator wafer although other platforms are possible. The device employs a Bragg gratings as the partial return device 18 and an echelle grating as the combiner 26. The output waveguide 36 guides the amplified light signal to an optical fiber 40. The optical fiber 40 can be glued to the device.

Figure 3:
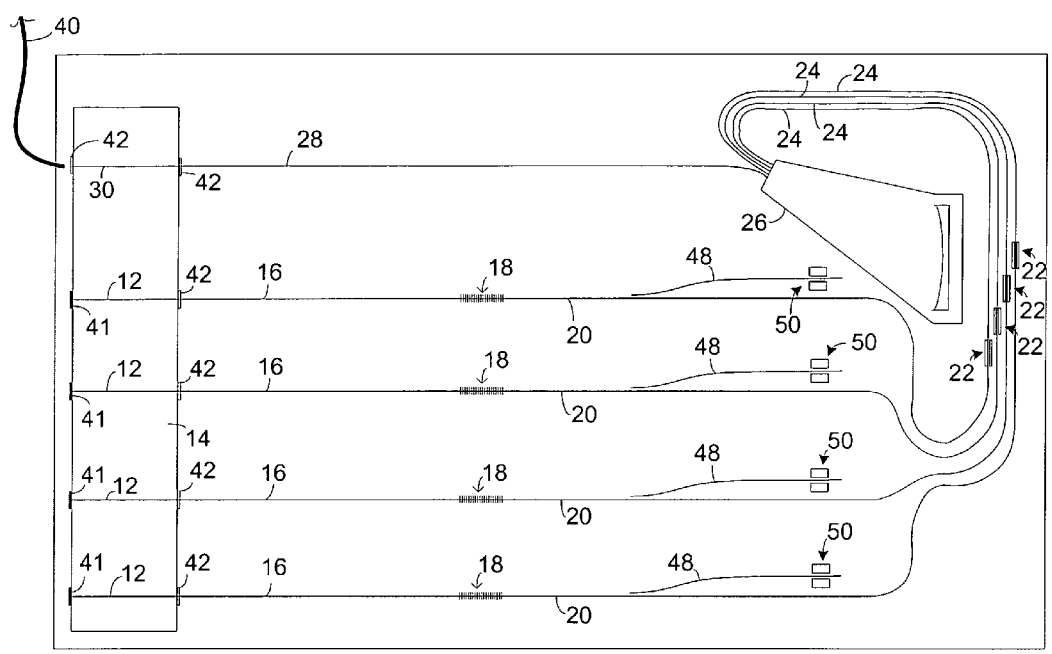
FIG. 3 through FIG. 5 are each a topview of a different embodiment of the device illustrated in FIG. 2.

The second amplifier waveguide 34 and the output waveguide 36 are optional. For instance, FIG. 3 is a topview of a device where the first amplifier waveguide 30 also serves as the output waveguide 36. An optical fiber 40 receives the amplified light signal from the first amplifier waveguide 30. In some instances, the gain medium 14 is too thin to properly support attachment of the optical fiber 40 directly to the gain medium 14. In these instances, there may be an air gap between the gain medium 14 and the optical fiber 40. A lens or fiber lens can be used to focus the amplified light signal onto a facet of the optical fiber 40.

Figure 4:
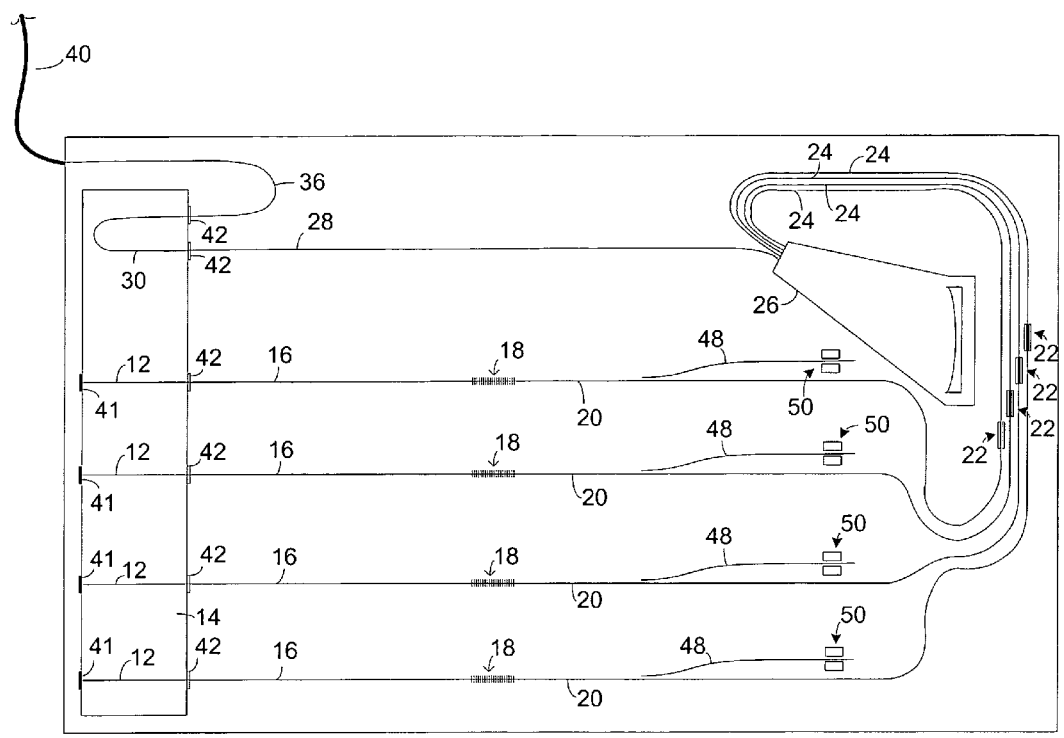

As an alternative to the second amplifier waveguide 34 and the amplifier reflector 32 shown in FIG. 1, the first amplifier waveguide 30 can be curved. For instance, FIG. 4 is a topview of a device where the first amplifier waveguide 30 replaces the second amplifier waveguide 34 and the amplifier reflector 32.

Figure 5:
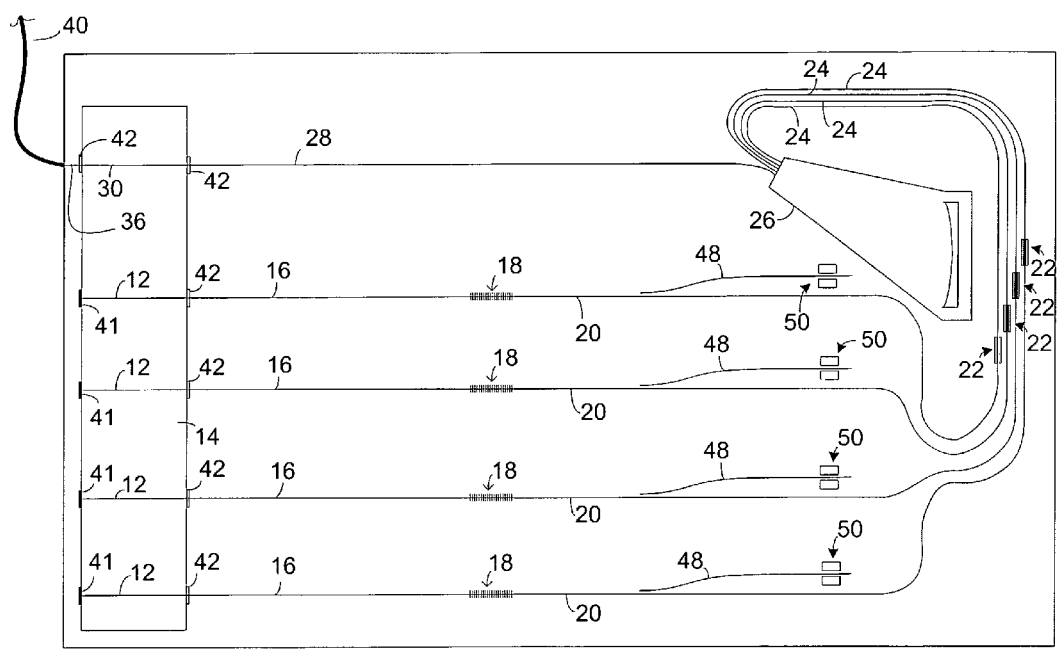

FIG. 5 is a topview of a device where the gain medium 14 is centrally positioned on the device and the output waveguide 36 receives the amplified light signal from a side of the gain medium 14 that is different from the side through which the amplified light signal entered the gain medium 14. More specifically, FIG. 5 shows the gain medium 14 between the output waveguide 36 and the common waveguide 28. Gain medium chips are generally constructed by cleaving them from a larger wafer. The cleaving process generally results in the gain medium chip having an inconsistent width. This inconsistency can be on the order of 10 μm. As a result, aligning facets on the gain medium chip with facets on opposing sides of the gain medium 14 can be difficult and/or produce poor results. For instance, an inconsistent width of a gain medium chip can complicate alignment of the facets on the amplifier waveguides and gain waveguides with the facet of the output waveguide 36, the common waveguide 28, and cavity waveguides 16. In some instances, this difficulty can be resolved by etching the gain medium 14 from the wafer rather than using cleaving.

Figure 6:
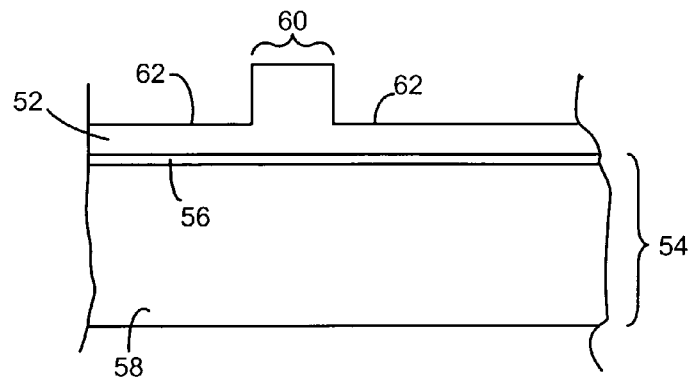
FIG. 6 is a cross-section of a waveguide constructed on a silicon-on-insulator wafer.

FIG. 6 illustrates a suitable construction for waveguides on the device of FIG. 2 through FIG. 5. FIG. 6 is a cross section of a waveguide on the device. For instance, FIG. 6 can be a cross-section of the cavity waveguides 16, the laser waveguides 20, modulated waveguides 24, common waveguide 28, coupled wavegides, and/or output waveguides 36. In one example, each of the cavity waveguides 16, the laser waveguides 20, modulated waveguides 24, common waveguide 28, coupled wavegides, and/or output waveguides 36 is constructed according to FIG. 6. The device includes a light-transmitting medium 52 on a base 54 that includes an optical insulator 56 positioned on a substrate 58. Suitable light-transmitting media include, but are not limited to, silicon, polymers, silica, SIN, GaAs, InP and LiNbO$_3$.

The waveguide is partially defined by a ridge 60 of the light-transmitting medium 52 extending outward from slab regions 62 of the light-transmitting medium 52. The ridge 60 and the base 54 together define a portion of the light signal-carrying region where light signals are constrained within the waveguide. For instance, the ridge 60 of light-transmitting medium 52 can optionally include a cladding (not shown) with an index of refraction that is less than the index of refraction of the light-transmitting medium 52. Likewise, the optical insulator 56 can have an index of refraction that is less than an index of refraction of the light-transmitting medium 52. The drops in index of refraction causes light signals being carried within the light signal-carrying region to be reflected back into the light signal-carrying region. Accordingly, the light signal is constrained between the ridge 60 and the optical insulator 56. Suitable claddings include, but are not limited to, silicon nitride (SiN) and silica (SiO$_2$) and can include one layer or more than one layer of material.

A suitable platform having a structure according to FIG. 6 is a silicon-on-insulator wafer although other platforms can be used. A silicon-on-insulator wafer includes a silicon layer positioned on a base. The silicon layer serves as the light-transmitting medium 52 through which light signals are guided. The base includes a layer silica positioned on a silicon substrate. The layer of silica can serve as the optical insulator 56 and the silicon substrate can serve as the substrate 58.

Figure 7A:
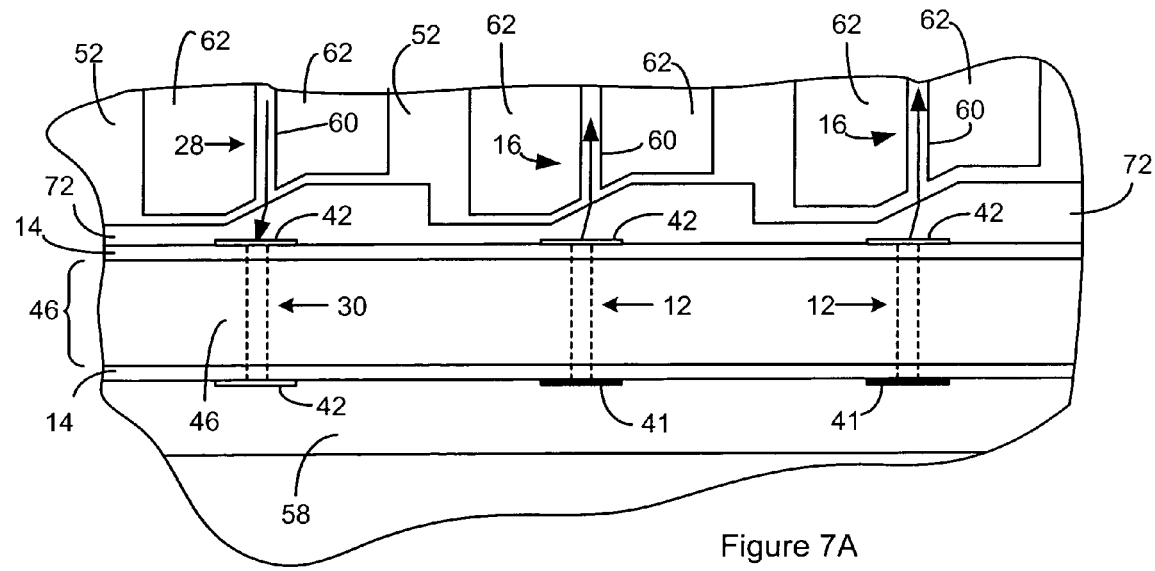
FIG. 7A through FIG. 7B illustrate a suitable interface between an optical device and a laser bar that includes a gain medium configured to provide both laser and amplifier functionality to the device.
Figure 7B:
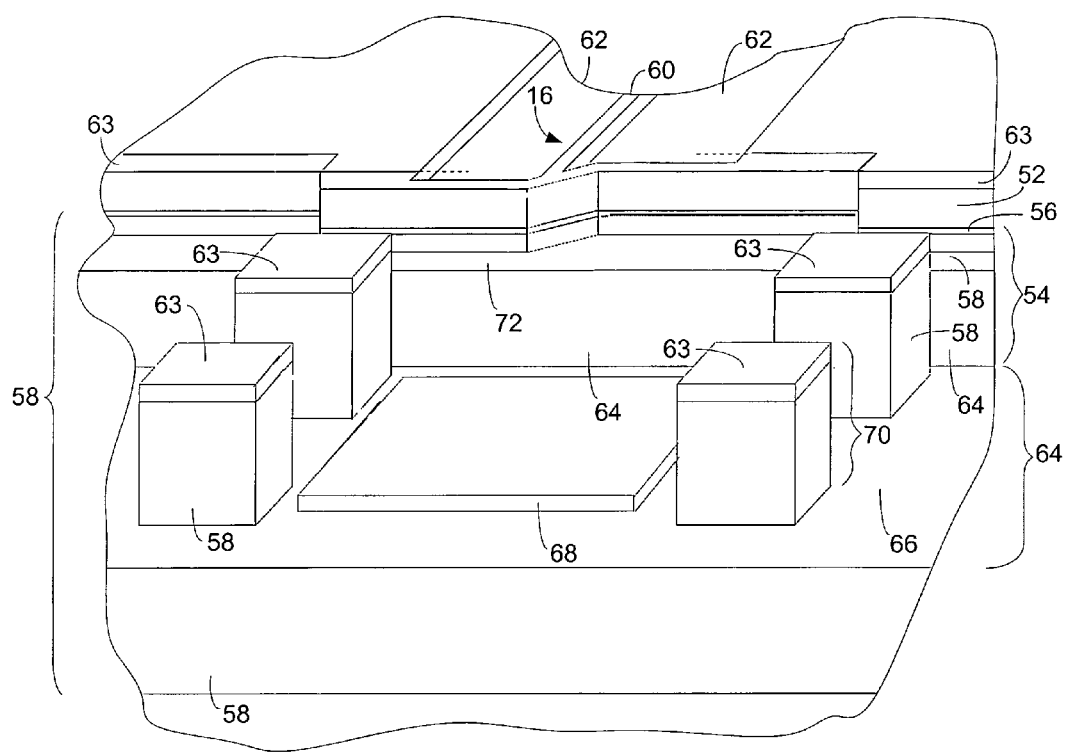

The gain media illustrated in FIG. 1 through FIG. 6 can be included in a laser bar. FIG. 7A through FIG. 7B illustrate a suitable interface between an optical device and a laser bar that includes the gain medium 14. FIG. 7A is a topview of the optical device. The illustrated optical device is configured according to FIG. 3 in order to simplify the illustration. As a result, the laser bar is shown positioned at an edge of the device.

The portion of the device illustrated in FIG. 7A includes the common waveguide 28. A first amplifier waveguide 30 on the laser bar receives an output light signal from the common waveguide 28. Since a ridge 76 for the first amplifier waveguide 30 is on a bottom side of the laser bar and FIG. 7A is a topview, the location of the ridge 76 for the first amplifier waveguide 30 is shown by dashed lines. The output light signal exits the common waveguide 28 through a facet. The facet can be angled at less than 90° relative to the direction of propagation through the common waveguide 28 at the facet. The angle can reduce performance reductions associated with back reflection.

The output light signal is transmitted through a facet of the first amplifier waveguide 30 upon entering the first amplifier waveguide 30, is amplified, and is then transmitted through a second facet of the first amplifier waveguide 30 as an amplified light signal. As a result, an anti-reflective coating 42 is located on both facets of the first amplifier waveguide 30. Suitable anti-reflective coatings 42 include, but are not limited to, single-layer coatings such as silicon nitride or aluminum oxide, or multilayer coatings which may contain silicon nitride, aluminum oxide, and/or silica.

The portion of the device illustrated in FIG. 7A also includes cavity waveguides 16 that each receives the first portion of a light signal from a different gain waveguide 12 on the laser bar. Since a ridge 76 for each of the gain waveguides 12 is on a bottom side of the laser bar and FIG. 7A is a topview, the locations of the ridges 76 for the gain waveguides 12 are each shown by dashed lines. The light signals each enter the cavity waveguides 16 through a facet. The facet can be angled at less than 90° relative to the direction of propagation through the cavity waveguide 16 at the facet. The angle can reduce performance reduction associated with back reflection.

The side of the gain medium 14 at which the first portion of the light signal is reflected includes a material that serves as the reflector 41. A suitable material for forming the reflector 41 includes, but is not limited to, a layer of metal on the layer of gain medium 14. The side of the gain medium 14 through which the first portion of the light signal is transmitted includes an anti-reflective coating 42. A material that serves as a suitable anti-reflective coatings 42 includes, but is not limited to, single-layer coatings such as silicon nitride or aluminum oxide, or multilayer coatings which may contain silicon nitride, aluminum oxide, and/or silica.

FIG. 7B is a perspective view of a portion of the optical device shown in FIG. 7A. The illustrated portion of the optical device is suitable for interfacing with one of the lasers on the laser bar or with the amplifier on the laser bar. The laser bar is not illustrated in FIG. 7B in order to make the portion of the optical device under the laser bar visible. A cladding 63 is shown on the light-transmitting medium 52. While the cladding 63 is present over the waveguides and in the trenches, the cladding 63 is not shown in these locations in order to make certain features of the optical device readily visible.

A recess 64 extends into the base 54 to form a laser bar platform 66. Contact pads 68 positioned on the laser bar platform 66 can be employed for providing electrical communication with a laser on the laser bar or with the amplifier on the laser bar. One or more stops 70 extend upward from the laser bar platform 66. For instance, FIG. 7B illustrates four stops 70 extending upward from the laser bar platform 66. The stops 70 include the cladding 63 positioned on a base portion. The substrate 58 can serve as the base portion of the stops 70 and the stop 70 can exclude the light insulator 56 or be made of the same material as the light insulator 56. The portion of the substrate 58 included in the stops 70 can extend from the platform up to the level of the light insulator 56. For instance, the stops 70 can be formed by etching through the light insulator 56 and using the underlying substrate 58 as an etch-stop. The cladding 63 can then be formed on the first light-transmitting medium 52 at the same time the cladding 63 is formed on the base portion of the stops 70.

A secondary platform 72 can optionally be positioned between the facet of the waveguides and the laser bar platform 66. The secondary platform 72 is elevated relative to the laser bar platform 66. For instance, the secondary platform 72 can be above the laser bar platform 66 and at or below the level of the light insulator 56. The secondary platform 72 can essentially be the top of the substrate 58 or the secondary platform 72 can be positioned below the level of the light insulator 56 as illustrated in FIG. 7B. Alternately, the secondary platform 72 can be etched concurrently with the base portion of the stops 70 resulting in the secondary platform 72 and the base portion of the stops 70 having about the same height above the laser bar platform 66. Alternately, the secondary platform 72 may not be present at all. For instance, the portion of the base 54 between the laser bar platform 66 and the waveguide facet can be substantially vertical relative to the laser bar platform 66.

The optical device includes one or more alignment marks (not shown). Suitable marks include recesses that extend into the optical device. An alignment recess can extend into the first light-transmitting medium 52 and/or the base 54. In some instances, one or more of the alignment recesses extend into the secondary platform 72. During attachment of the laser bar to the optical device, the alignment recesses can be aligned with secondary alignment recesses (not shown) on the laser bar in order to achieve horizontal alignment of the laser bar relative to the optical device.

Figure 8A:
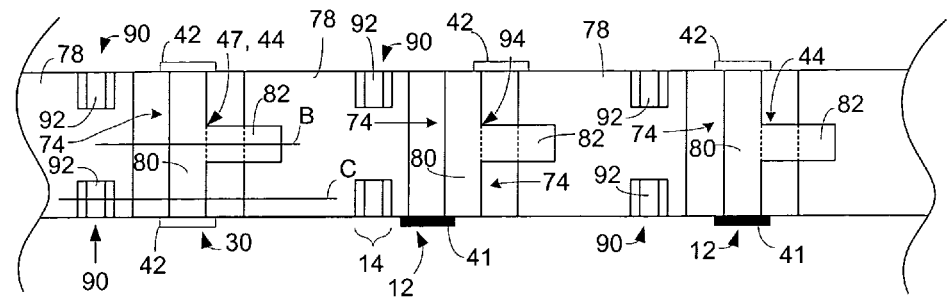
FIG. 8A through FIG. 8D illustrate a laser bar that is suitable for use with an optical device constructed according to FIG. 7A through FIG. 7B.
Figure 8B:
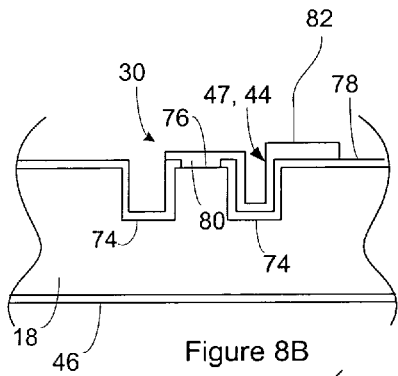
Figure 8C:
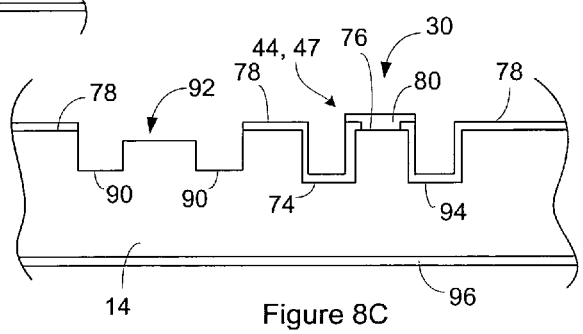
Figure 8D:
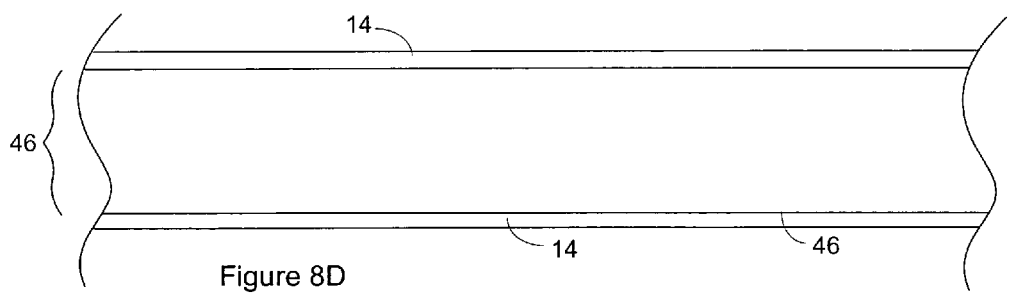

FIG. 8A through FIG. 8D illustrate a laser bar that is suitable for use with an optical device constructed according to FIG. 7A through FIG. 7B. FIG. 8A is a bottom view of the laser bar. FIG. 8B is a cross-section of the laser bar shown in FIG. 8A taken along the line labeled B in FIG. 8A. FIG. 8C is a cross-section of the laser bar shown in FIG. 8A taken along the line labeled C in FIG. 8A. FIG. 8D is a topview of the laser bar. The laser bar includes waveguides defined in the gain medium 14 for multiple lasers and an amplifier. Trenches 74 extending into the gain medium 14 define ridges 76 in the gain medium 14. The ridges 76 each defines a first amplifier waveguide 30 or one of the gain waveguides 12. Suitable gain media include, but are not limited to, InP, InGaAsP, and GaAs.

A laser bar cladding 78 is positioned on the gain medium 14. A first electrical conductor 44 positioned on the cladding 78 includes a contact region 80 that extends through an opening in the laser cladding 78 into contact with a top of the ridge 76. The first electrical conductor 44 extends from the contact region 80 across a trench 74 to a contact pad 82. The contact pad 82 can be employed to apply electrical energy to the laser. One of the illustrated first electrical conductors 44 can also serve as the amplifier electrical contact 47.

One or more alignment trenches 90 are positioned between adjacent ridges 76. For instance, FIG. 8A illustrates two alignment trenches 90 between adjacent ridges 76 and positioned on opposing sides of the laser bar. A secondary stop 92 extends upward from the bottom of the alignment trench.

Although FIG. 8A through FIG. 8D illustrate a secondary stop 92 extending upward from a bottom of the alignment trench such that walls of the secondary stop are spaced apart from walls of the alignment trench, the bottom of the alignment trench can be substantially flat. However, an embodiment having walls of the secondary stop spaced apart from walls of the alignment trench may be preferred to reduce etch induced inconsistencies on the tops of the secondary stops.

The common electrical contact 46 is positioned under the gain medium 14. The common electrical contact 46 can be used as a ground for each of the lasers when applying electrical energy to a laser and also for the amplifier when applying electrical energy to the amplifier.

Figure 9A:
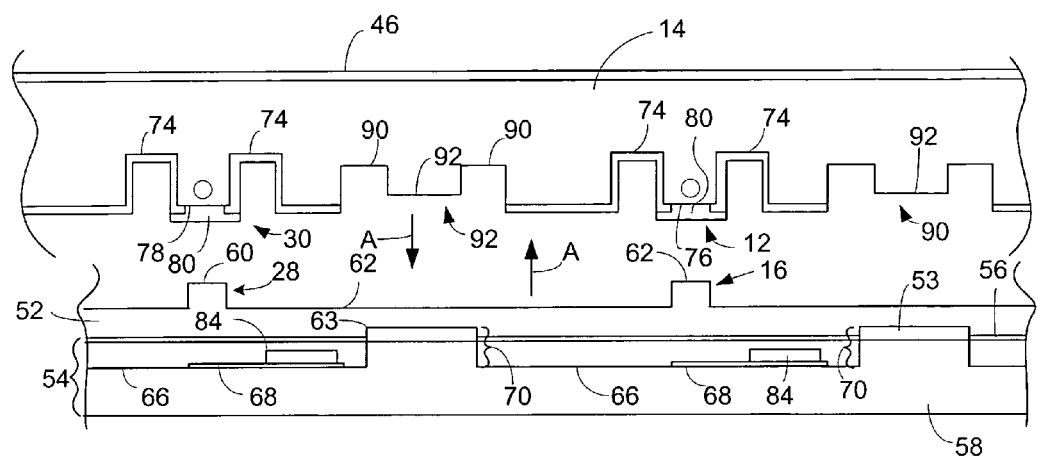
FIG. 9A illustrates assembly of a system using an optical device constructed according to FIG. 7A through FIG. 7B and a laser bar constructed according to FIG. 8A through FIG. 8D.

FIG. 9A illustrates assembly of the optical system using an optical device constructed according to FIG. 7A through FIG. 7B and a laser bar constructed according to FIG. 8A through FIG. 8D. The optical device illustrated in FIG. 9A does not show either a cross-sectional view or a sideview. Instead, the view of the optical device shows the relative positions of different features of the optical device when looking at a sideview of the optical device. In contrast, the laser bar illustrated in FIG. 9A is a cross-sectional view of the laser bar such as the cross section of FIG. 8C.

The device can be assembled by moving the optical device and the laser bar toward one another as indicated by the arrows labeled A. Each of the stops 70 on the optical device is aligned with one of the secondary stops on the laser bar.

FIG. 9A shows solder pads 84 positioned on the contact pads 68 on the laser bar platforms 66. The solder pads 84 can be used to immobilize the laser bar relative to the optical device once the laser bar is positioned on the optical device. The solder pads 84 can also provide electrical communication between the contact pads 68 on the laser platform and the contact pads 82 on the laser bar. Accordingly, the electronics are in electrical communication with the common electrical contact 46 and each of the contact pads 68 on the laser platform. The electronics can apply electrical energy to each of the lasers and/or the amplifier by applying electrical energy across the associated contact pad 68 and the common electrical contact 46.

Figure 9B:
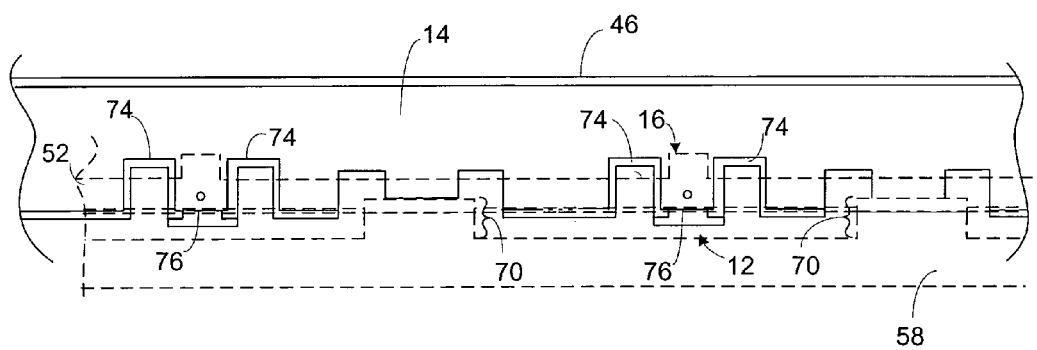
FIG. 9B illustrates the optical device as shown in FIG. 9A and the laser bar as shown in FIG. 9A assembled in an optical assembly according to FIG. 7A.

FIG. 9B illustrates the optical device as shown in FIG. 9A and the laser bar as shown in FIG. 9A assembled in an optical assembly according to FIG. 7A. For the purposes of clarity, the optical device is shown by the dashed lines while the laser bar is shown by solid lines. The solder pads 84 are also removed from this illustration. Each of the stops 70 on the optical device meets one of the secondary stops on the laser bar. As a result, the vertical movement of the optical device and the laser bar toward one another is limited by the stops 70 butting against the secondary stops.

In FIG. 9A, circles show the mode of the first light signal portion in the gain waveguides 12 and also in the mode of the amplified light signal in the first amplifier waveguide 30. As is evident from FIG. 9B, the modes are each aligned with the facets of a cavity waveguide 16 or the output waveguide 36.

Additional details regarding the fabrication, structure, and/or alignment of a laser bar with an optical device as shown in FIG. 7A through FIG. 9B can be found in U.S. patent application Ser. No. 12/215,693, filed on Jun. 28, 2008, granted U.S. Pat. No. 7,658,552, entitled "Interface Between Light Source and Optical Component, and incorporated herein in its entirety.

FIG. 7A through FIG. 8B illustrate construction of a device according to FIG. 3, however, the disclosure of FIG. 7A through FIG. 8B can be adapted to provide the systems shown in FIG. 2, FIG. 4, and FIG. 5. For instance, the system of FIG. 2 can be generated by converting one of the anti-reflective coatings 42 shown in FIG. 7A to an amplifier reflector and then forming a second amplifier waveguide 34 in the gain medium 14 so that the first amplifier waveguide 30 and the second amplifier waveguide 34 meet at that amplifier reflector. The system of FIG. 4 can be generated by curving the first amplifier waveguide 30 of FIG. 7A through FIG. 9B as shown in FIG. 4 and adding an output waveguide 36 to the device so a facet of the output waveguide 36 is aligned with the facet of the first amplifier waveguide 30. The system of FIG. 5 can be generated by making the recess in which the gain medium is located centralized on the device and placing the output waveguide on the device so it is aligned with the first amplifier waveguide.

Figure 10:
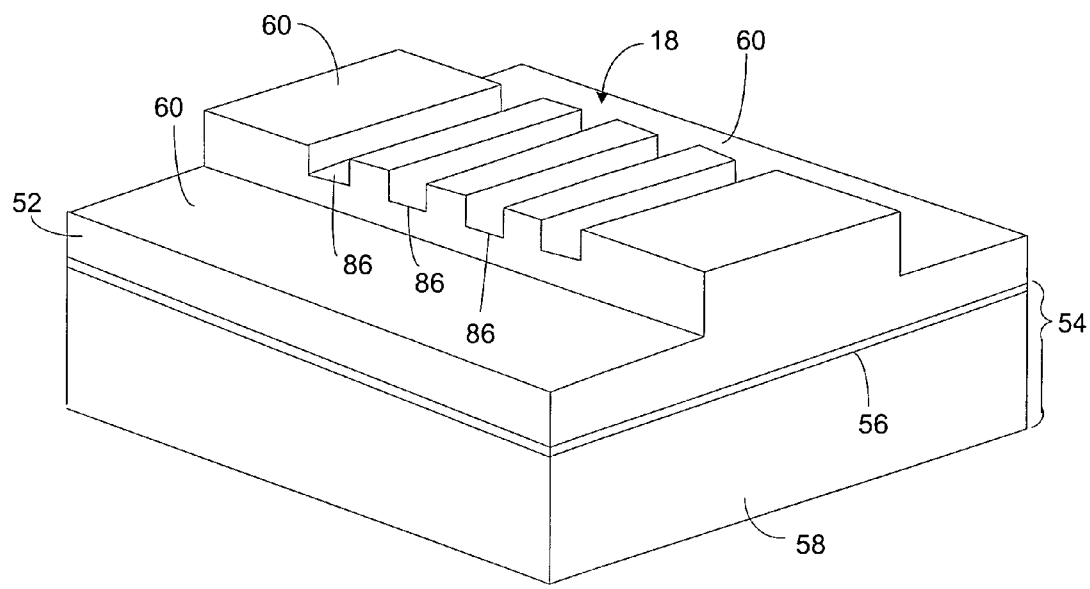
FIG. 10 is a perspective view of a portion of a device that includes a Bragg grating constructed on a silicon-on-insulator wafer.

Suitable partial return devices 18 include, but are not limited to, a reflective optical grating such as a Bragg grating. FIG. 10 is a perspective view of a portion of the device that includes a Bragg grating constructed on a silicon-on-insulator wafer. Recesses 86 extend into the top of the ridge 60 of the waveguide. The recesses 86 are filled with a medium having a lower index of refraction than the light-transmitting medium 52. The medium can be a solid or a gas such as air. Accordingly, the recesses 86 provide the variations in the index of refraction of the waveguide that allow the recesses 86 to act as a Bragg grating. The Bragg grating is illustrated with only four recesses 86 in order to simplify the illustration. However, the Bragg grating can include more than four recesses 86. The recesses 86 are arranged so as to form a periodic pattern in the ridge 60. The range of wavelengths reflected by a Bragg grating can be altered by changing the depth and/or period of the grooves as well as other variables. Accordingly, each of the laser cavities can include a Bragg grating configured to reflect a different range of wavelengths.

The light sensor 50 can be a conventional photodetector such as a photodiode. A variety of other light sensor 50 constructions are suitable for use with waveguides on a silicon-on-insulator platform. For instance, the light sensor 50 can be constructed as shown in U.S. patent application Ser. No. 12/804,769, filed Jul. 28, 2010, and entitled "Light Monitor Configured to Tap Portion of Light Signal from Mid-Waveguide;" and/or in U.S. patent application Ser. No. 12/803,136, filed Jun. 18, 2010, and entitled "System Having Light Sensor with Enhanced Sensitivity;" and/or in U.S. patent application Ser. No. 12/799,633, filed Apr. 28, 2010, and entitled "Optical Device Having Partially Butt-Coupled Light Sensor;" and/or in U.S. patent application Ser. No. 12/589,501, filed Oct. 23, 2009, and entitled "System Having Light Sensor with Enhanced Sensitivity;" and/or in U.S. patent application Ser. No. 12/584,476, filed Sep. 4, 2009, and entitled "Optical Device Having Light Sensor Employing Horizontal Electrical Field;" each of which is incorporated herein in its entirety.

The modulators 22 are preferably each an intensity modulator 22 but can be other modulators 22 such as phase modulators 22. A variety of different modulator 22 constructions are suitable for use with waveguides on a silicon-on-insulator platform. In some instances, the modulators 22 are constructed and operated as shown in U.S. patent application Ser. No. 11/146,898; filed on Jun. 7, 2005; entitled "High Speed Optical Phase Modulator," and now U.S. U.S. Pat. No. 7,394,948; or as disclosed in U.S. patent application Ser. No. 11/147,403; filed on Jun. 7, 2005; entitled "High Speed Optical Intensity Modulator," and now U.S. Pat. No. 7,394,949; or as disclosed in U.S. patent application Ser. No. 12/154,435; filed on May 21, 2008; entitled "High Speed Optical Phase Modulator," and now U.S. Pat. No. 7,652,630; or as disclosed in U.S. patent application Ser. No. 12/319,718; filed on Jan. 8, 2009; and entitled "High Speed Optical Modulator;" or as disclosed in U.S. patent application Ser. No. 12/928,076; filed on Dec. 1, 2010; and entitled "Ring Resonator with Wavelength Selectivity;" or as disclosed in U.S. patent application Ser. No. 12/228,671, filed on Aug. 13, 2008, and entitled "Electrooptic Silicon Modulator with Enhanced Bandwidth;" or as disclosed in U.S. patent application Ser. No. 12/653,547, filed on Dec. 15, 2009, and entitled "Optical Device Having Modulator Employing Horizontal Electrical Field;" or as disclosed in U.S. patent application Ser. No. 12/660,149, filed on Feb. 19, 2010, and entitled "Reducing Optical Loss in Optical Modulator Using Depletion Region;" each of which is incorporated herein in its entirety.

Figure 11:
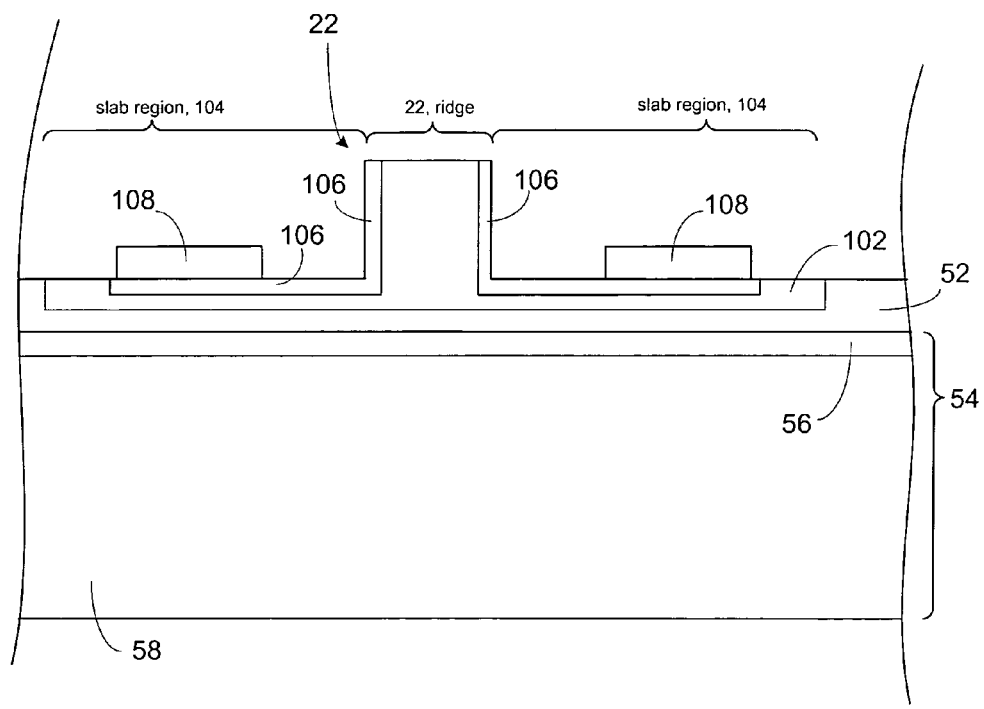
FIG. 11 is a cross section of an optical modulator that employs the Franz-Keldysh effect to modulate light signals.

In some instances, modulators 22 that generate photocurrent in response to the modulation of light signals are preferred modulators 22 because they can also be used as a light sensor and each of these modulators 22 can accordingly replace one of the coupled waveguides 48 and light sensors. Examples of these modulators 22 are modulators 22 that make use of the Franz Keldysh effect. An example of such as modulator 22 is disclosed in U.S. patent application Ser. No. 12/653,547. FIG. 11 is a cross section of the modulator 22 disclosed in U.S. patent application Ser. No. 12/653,547. A ridge 100 of an electro-absorption medium 102 extends upward from a slab region 104 of the electro-absorption medium 102. Doped regions 106 are both in the slab regions 104 of the electro-absorption medium 102 and also in the ridge 100 of the electro-absorption medium 102. For instance, doped regions 106 of the electro-absorption medium 102 are positioned on the lateral sides of the ridge 100 of the electro-absorption medium 102. Additionally, the doped regions 106 extend from the ridge 100 into the slab region 104 of the electro-absorption medium 102. FIG. 11 shows the transition of a doped region 106 from the ridge 100 of the electro-absorption medium 102 into the slab region 104 of the electro-absorption medium 102 as continuous and unbroken. When one of the doped regions is an n-type doped region, the other doped region is a p-type doped region.

Electrical conductors 108 are positioned on the slab region 104 of the electro-absorption medium 102. In particular, the electrical conductors 108 each contact a portion of a doped region 106 that is in the slab region 104 of the electro-absorption medium 102.

During operation of the modulators 22 of FIG. 11, the electronics can be employed to apply electrical energy to the electrical conductors 108 so as to form an electrical field in the electro-absorption medium 102. For instance, the electronics can form a voltage differential between the doped regions 106. The electrical field can be formed without generating a significant electrical current through the electro-absorption medium 102. The electro-absorption medium 102 can be a medium in which the Franz-Keldysh effect occurs in response to the application of the electrical field. The Franz-Keldysh effect is a change in optical absorption and optical phase by an electro-absorption medium 102. For instance, the Franz-Keldysh effect allows an electron in a valence band to be excited into a conduction band by absorbing a photon even though the energy of the photon is below the band gap. To utilize the Franz-Keldysh effect the active region can have a slightly larger bandgap energy than the photon energy of the light to be modulated. The application of the field lowers the absorption edge via the Franz-Keldysh effect and makes absorption possible. The hole and electron carrier wavefunctions overlap once the field is applied and thus generation of an electron-hole pair is made possible. As a result, the electro-absorption medium 102 can absorb light signals received by the electro-absorption medium 102 and increasing the electrical field increases the amount of light absorbed by the electro-absorption medium 102. Accordingly, the electronics can tune the electrical field so as to tune the amount of light absorbed by the electro-absorption medium 102. As a result, the electronics can intensity modulate the electrical field in order to modulate the light signal. Additionally, the electrical field needed to take advantage of the Franz-Keldysh effect generally does not involve generation of free carriers by the electric field.

When the modulator 22 is operated as described above, a photocurrent is generated in the modulator 22 in response to the modulation of a light signal. Since the electronics can be configured measure the level of photocurrent being generated, the modulator 22 can also be used as a light sensor 50. The electronics can adjust the level of electrical energy applied to each of the lasers in response to amount of photocurrent being indicated by the associated modulator 22 in a feedback loop. For instance, if the electronics determine that the amount of photocurrent being generated in a modulator 22 is above a threshold, the electronics can reduce the level of electrical energy being applied to the associated laser in an effort to reduce the level of photocurrent being generated in the modulator 22. These features allow modulator 22 that can also function as light sensors to each replace one of the coupled waveguides 48 and light sensors 50 shown on the embodiments of FIG. 1 through FIG. 5. Accordingly, the coupled waveguides 48 and the associated light sensors 50 are optional.

Suitable electro-absorption media include semiconductors. However, the light absorption characteristics of different semiconductors are different. A suitable semiconductor for use with modulators 22 employed in communications applications includes $Ge_{1-x}Si_x$ (germanium-silicon) where x is greater than or equal to zero. In some instances, x is less than 0.05, or 0.01. Changing the variable x can shift the range of wavelengths at which modulation is most efficient. For instance, when x is zero, the modulator 22 is suitable for a range of 1610-1640 nm. Increasing the value of x can shift the range of wavelengths to lower values. For instance, an x of about 0.005 to 0.01 is suitable for modulating in the c-band (1530-1565 nm). Additional details regarding the fabrication and/or structure of modulators 22 that employ the Franz-Keldysh effect are disclosed in U.S. patent application Ser. No. 12/653,547.

Suitable combiners 26 for use with the device can be either wavelength dependent multiplexers such as echelle gratings or arrayed waveguide gratings. In some instances, the combiner 26 can be a wavelength independent combiner such as combiners that employ waveguides that intersect one another so as to combine light signals from different waveguides. Suitable echelle grating structures and/or methods of fabricating echelle gratings on a silicon-on-insulator wafer are disclosed in U.S. patent application Ser. No. 12/800,600, filed on May 18, 2010, and entitled "Extension of Steps in Reflective Optical Gratings;" and also in U.S. Provisional patent application Ser. No. 61/284,723, filed on Dec. 23, 2009, and entitled "Reducing Optical Loss in Reflective Optical Gratings;" and also in U.S. patent application Ser. No. 12/927,412, filed on Nov. 12, 2010, and entitled "Reducing Optical Loss in Reflective Optical Gratings;" and also in U.S. patent application Ser. No. 12/321,386, filed on Jan. 16, 2009, and entitled "Optical Component Having Features Extending Different Depths into a Light Transmitting Medium," each of which is incorporated herein in its entirety. The echelle grating structures and/or methods of echelle grating fabrication disclosed in these patent applications can be employed in the combiner 26 of a device constructed according to FIG. 1A through FIG. 5. An example of a suitable wavelength independent combiner that employ one or more y-junctions is disclosed in U.S. patent application Ser. No. 10/644,395, filed on Aug. 19, 2003, and entitled "Multiplexer Having Improved Efficiency," and now U.S. Pat. No. 7,805,037; and also in U.S. Provisional patent application Ser. No. 10/600,748, filed on Jun. 20, 2003, and entitled "Multiplexer Having Improved Efficiency," each of which is incorporated herein in its entirety. The y-junction structures and/or methods of fabrication disclosed in these patent applications can modified to employ single mode waveguides or multimode waveguides and can be employed in the combiner 26 of a device constructed according to FIG. 1A through FIG. 5.

In some instances, wavelength dependent multiplexers can become more desirable than wavelength independent combiners as the number of light signals that are combined by the combiner 26 increases. The optical loss associated with combiners increases as the numbers of light signals that must be combined increases. In some instances, the amount of optical loss is stronger in wavelength independent combiners than in wavelength dependent multiplexers. Accordingly, the use of wavelength dependent multiplexers may become more desirable as the number of light signals combined by the combiner 26 increases.

Suitable electronics for operating the above monitors can include a controller. A suitable controller includes, but is not limited to, a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions attributed to the electronics. A general-purpose processor may be a microprocessor, but in the alternative, the controller may include or consist of any conventional processor, microcontroller, or state machine. A controller may also be implemented as a combination of computing devices, e.g., a combination of a DSP and a microprocessor, a plurality of microprocessors, one or more microprocessors in conjunction with a DSP core, or any other such configuration.

The electronics can optionally include a memory in communication with the controller. The electronics can store data for executing the functions of the electronics in the memory. The memory can be any memory device or combination of memory devices suitable for read and/or write operations.

In some instances, the electronics include a computer-readable medium in communication with the controller. The computer-readable medium can have a set of instructions to be executed by the controller. The controller can read and execute instructions included on the computer-readable medium. The controller executes the instructions such that the electronics perform one or more of the described functions. The computer-readable medium cab be different from the memory or can be the same as the memory. Suitable computer-readable media include, but are not limited to, optical discs such as CDs, magnetic storage diskettes, Zip disks, flash memories, magnetic tapes, RAMs, and ROMs. Some functions of the electronics may be executed using hardware as opposed to executing these functions in firmware and/or software.

Although the device is described in the context of each laser cavity producing a laser signal having different wavelengths, the device can be constructed such that two or more of the laser cavities generate laser signals having the same range of wavelengths. The gain waveguides and/or cavity waveguides of laser cavities configured to generate lasers signals having the same wavelength can be optically coupled as a result of their proximity on the device. Optical coupling of these one or more of these waveguides can increase the power of the laser signals as described in U.S. patent application Ser. No. 61/463,054, filed on Feb. 10, 2011, entitled "Laser Combining Light Signals from Multiple Laser Cavities," and incorporated herein in its entirety. The gain waveguides and/or cavity waveguides of laser cavities configured to generate lasers signals of different wavelengths are optically decoupled.

Although the device is described as having multiple laser cavities, the device can include a single laser cavity and an amplifier that share the same gain medium. In this instance, there may not be multiple modulated light signals present for a combiner to combine. As a result, the device need not include a combiner and the combiner is optional.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
a continuous gain medium located on a substrate;
one or more laser cavities on the substrate, each laser cavity guiding a different light signal through the gain medium, each of the laser cavities outputting a laser light signal;
an amplifier on the substrate, the amplifier guiding an amplified light signal through the gain medium; and
waveguides on the substrate, the waveguides receiving light from the one or more laser signals after the received light has exited from the gain medium,
the waveguides guide the received light to the amplifier.

2. The optical device of claim 1, wherein the one or more lasers are multiple lasers that each guides a different light signal through the gain medium.

3. The optical device of claim 1, wherein the waveguides guide the received light to one or more modulators such that each modulator receives light from a different one of the laser light signals and the modulators are each configured to modulate the received laser light signal into a modulated signal.

4. The optical device of claim 3, wherein the amplified light signal includes light from each of the modulated signals.

5. The optical device of claim 3, further comprising:
a combiner that receives light from the modulated signals and combines the received light from the modulated signals into an output signal.

6. The optical device of claim 5, wherein the amplifier receives light from the output signal and amplifies the light from the output signal so as to generate the amplified signal.

7. The optical device of claim 4, wherein an optical fiber receives the amplified signal from the amplifier.

8. The optical device of claim 1, wherein each of the laser cavities guides one of the laser signals through a gain waveguide defined in the gain medium and the amplifier guides the amplified light signal through one or more amplifier waveguides defined in the gain medium.

9. The optical device of claim 1, wherein the waveguides are each configured to guide the received light through a light-transmitting medium, the light-transmitting medium is silicon and the gain medium is InP.

10. The optical device of claim 9, wherein each of the waveguides is defined by a ridge of the light-transmitting medium extending upward from slabs of the light-transmitting medium.

11. The optical device of claim 1, wherein each of the laser cavities guides one of the light signals through a different region of the gain medium.

12. The optical device of claim 1, wherein the waveguides guide the received light such that the amplified light signal includes light from the one or more laser light signals.

13. The optical device of claim 1, wherein the waveguides exclude the gain medium.

14. The optical device of claim 1, wherein the light from the laser signals exits from the gain medium before exiting from the one or more laser cavities.

15. The optical device of claim 1, wherein the light from the laser signals exits from the gain medium upon exiting from the one or more laser cavities.

16. The optical device of claim 1, wherein each of the laser cavities includes one of the waveguides.

\* \* \* \* \*